United States Patent [19]

Shuskus et al.

[11] Patent Number: 5,252,512
[45] Date of Patent: Oct. 12, 1993

[54] TEOV DOPING OF GALLIUM ARSENIDE

[75] Inventors: Alexander J. Shuskus, West Hartford, Conn.; Melvyn E. Cowher, East Brookfield, Mass.

[73] Assignee: United Technologies Corporation, Hartford, Conn.

[21] Appl. No.: 963,234

[22] Filed: Oct. 19, 1992

Related U.S. Application Data

[63] Continuation of Ser. No. 431,492, Nov. 3, 1989, abandoned.

[51] Int. Cl.$^5$ .................................. H01L 21/205
[52] U.S. Cl. .......................... 437/81; 437/85; 437/110; 437/133; 437/939; 437/945; 437/959; 437/911; 148/DIG. 23; 148/DIG. 40; 148/DIG. 41; 148/DIG. 130
[58] Field of Search ............. 437/81, 85, 95, 96, 437/105, 107, 108, 110, 133, 939, 959, 971; 148/DIG. 23, DIG. 40, DIG. 41, DIG. 65, DIG. 130; 156/610, 611, 612, 613, 614

[56] References Cited

U.S. PATENT DOCUMENTS

| | | | |
|---|---|---|---|
| 3,312,570 | 4/1967 | Ruehrwein | 437/81 |
| 4,147,571 | 4/1979 | Stringfellow et al. | 437/81 |
| 4,588,451 | 5/1986 | Vernon | 437/126 |
| 4,632,710 | 12/1986 | Van Rees | 437/81 |
| 4,659,401 | 4/1987 | Reif et al. | 437/105 |
| 4,767,494 | 8/1988 | Kobayashi et al. | 437/110 |
| 4,885,260 | 12/1989 | Ban et al. | 437/110 |
| 4,935,381 | 6/1990 | Speckman et al. | 437/81 |

OTHER PUBLICATIONS

Akiyama et al., "Growth of Vanadium-Doped Semi--Insulating GaAs by MOCVD" J. Crys. Growth, 68, (1984), pp. 39-43.

Akiyama et al., "Growth of GaAs on Si by MOCVD," J. Crys. Growth, 68 (1984), pp. 21-26.

Primary Examiner—Mary Wilczewski
Attorney, Agent, or Firm—Eric W. Petraske; George J. Romanik

[57] ABSTRACT

GaAs films compensated with TEOV to reduce free electron concentration are grown having superior morphology by heating the TEOV above the temperature used in the prior art, filtering the other constituents but not the TEOV, and reducing the arsenic ambient during the preliminary heating phase.

12 Claims, No Drawings

TEOV DOPING OF GALLIUM ARSENIDE

This application is a continuation of application Ser. No. 07/431,482, filed Nov. 3, 1989, now abandoned.

TECHNICAL FIELD

The field of the invention is that of growing epitaxial GaAs layers in optical devices through the MOCVD (metal organic chemical vapor deposition) process.

BACKGROUND ART

The vast majority of semiconductor device applications are satisfied employing epitaxial structures of ten micrometers or less in thickness. Therefore, it is not surprising that the conventional commercial MOCVD systems available today fall short of fulfilling the requirements for the growth of thick epitaxial layers having high structural integrity. The conventional systems begin to encounter problems when one attempts to exceed layer growths in excess of 15 $\mu$m in thickness. Prior work in growing GaAs has used a V/III ratio of 11.7:1 (As/Ga) and a growth temperature of 650 degrees Centigrade.

The growth of semi-insulating films of GaAs by the MOCVD process was not practical before the publication of the work of Akiyama, et al., J. Crystal Growth, 68, 39 (1984), which reported that triethoxyvanadyl [VO(OC$_2$H$_5$)$_3$] can be employed as an effective dopant which does not exhibit a memory effect. No data was presented on the physical properties of this material, nor were any caveats raised with regard to potential problems that must be addressed before TEOV can be used effectively without encountering any unexpected surprises.

DISCLOSURE OF THE INVENTION

The invention relates to a method of growing GaAs films for use in a structure comprising many alternate layers of GaAs and Al$_x$Ga$_{1-x}$As. Modifications to prior art processes include changing the V/III ratio (the ratio of As to Ga in the reactor, not the ratio of the carrier gases used to bring the As and Ga into the reactor), maintaining a reduced flow of arsine during preliminary heating, and controlling the substrate temperature.

BEST MODE OF CARRYING OUT THE INVENTION

A conventional atmospheric-pressure vertical reactor having a quartz tube of diameter 89 mm was used to develop improved parameters for GaAs growth in thick layers. In order to make effective improvements, three requirements must be addressed. The first and most important is the suppression of particulate fallout onto the substrate from nonadherent reactor wall deposits, since particulates will result in highly disturbed growth destroying the integrity of the device structure. The second is the suppression of particulates generated in the gas manifold which can reach the substrate during growth and lead to regions of locally disturbed growth resulting in scattering losses in the guided wave structures. The third is arriving at the proper growth parameters that will suppress nucleation and growth of crystallographic defects that lead to further degradation of the surface morphology.

The metallorganic precursors employed in the MOCVD process are extremely reactive, and the presence of moisture in the system, wall reactions, and reactions between the precursors in the manifold, will lead to particulate generation. For example, the reaction of trimethylaluminum (TMAL) with moisture will lead to generation of alumina particulates. Similarly, the reaction of TMAL with hydrogen selenide will not only deplete the N-type dopant source but will also form AlSe particles.

Commercial gas-line filters were used to remove particles found in the storage vessels and lines. Proper conditioning is important so that the filter does not serve as a source of moisture which would react with the highly reactive metal organic (MO) and hydride sources employed as precursors in the growth process. Some manufacturers use epoxy in the construction of their filters which results in a near endless supply of moisture rendering them useless for this application. The best gas-line filters for this application were found to be manufactured by Millipore. These are constructed of Teflon ® (E. I. Du Pont De Nemours, Wilmington, Del.), a commercially available polytetrafluoroethylene, and do not exhibit any tendency to react with the MO or hydride sources employed. Physisorbed moisture is readily removed from the filters by heating to 90° C. and purging with purified gas for an extended period of time. The filters used were rated to remove particulates as small as 0.02 $\mu$m.

Initially, a common filter for all sources was employed, but this led to rapid clogging of the filter. The triethoxyvanadyl was believed to be the primary cause. It is an oxygen bearing compound and exhibits a low vapor pressure as well. This would lead to physisorbed TEOV in the filter and subsequent reaction with the MO sources, generating solid particulates which then clog the filter. The gas manifold underwent a series of modifications before an acceptable configuration was arrived at in which reactions between the precursors were suppressed. In its final form, the manifold used individual filters for each precursor with the exception of TEOV, which tended to clog the filter in a short period of time. This is a consequence of the fact that it exhibits a low vapor pressure as well as a high viscosity. The filters were located in each line at a point just prior to the introduction of the precursor into the input manifold. The TEOV was introduced separately into the reactor downstream of the input manifold. This arrangement was found to be very effective, and the frequency of filter changes required to keep the system operating at peak performance were typically of the order of once every six months.

Nonadherent wall deposits can result in very gross structural defects. The thicker the layer growth required, the greater the probability that particulate fallout will be a problem when dealing with thick layer growth employing a conventional MOCVD system. In order to grow thick, defect free, epitaxial, multiple-waveguide structures (100 to 1000 $\mu$m), it was necessary to develop a means by which wall deposits could be suppressed or their adherence enhanced.

It is well known that at elevated temperatures GaAs will decompose unless maintained under an arsenic over-pressure. Therefore, at the start of a growth run the GaAs substrate is maintained under an arsine ambient, while being heated to the growth temperature. During this cycle which typically lasts about 20 to 30 minutes, a deposit of arsenic will build up on the walls of the reactor. It was suspected that this initial arsenic buildup did not bond well to the quartz walls of the reactor and so led to the poor adherence of the subsequent wall deposits. The arsenic flow during the heat-up cycle is usually the same as that employed during growth, and is far in excess of that required to prevent the loss of arsenic from the substrate which is an amount of arsine such that the partial pressure of As in the reactor ambient is equal to the vapor pressure of As above the GaAs surface. This realization led to reducing the arsine flow rate during substrate heating and resulted in a dramatic increase in the adherence of wall deposits. Epitaxial layer thicknesses of 100 $\mu$m have been achieved with only slight evidence of a few defects stemming from non-adherent wall deposits occurring in the latter stage of growth. The configuration of the atmospheric pressure reactor was a vertical quartz tube having an internal bore of 89 mm and jacketed for water cooling of the reactor walls. An inductively heated silicon carbide coated graphite susceptor was used for substrate heating. The reactants were introduced through a diffuser located at the top of the chamber. A commercially available reactor suitable for this process is the EMCORE GS-3200, available from the Emcore Corporation.

Initially, the growth of GaAs epitaxial layers was carried out employing a conventional V/III ratio of 11.7:1 (As:Ga) and growth temperature of 650° C. These conditions, used for the growth of thin epitaxial structures, produced films with excellent surface morphology. As the film thickness requirements increased, the surface morphology tended to degrade with the appearance of macroscopic crystallographic defects. The defects occur as slightly raised elongated regions approximately $60 \times 150$ $\mu$m in size and have the appearance of "footprints". These regions sometimes have inclusions of polycrystalline material. If one cleaves through one of the "footprints" and examines the specimen in cross-section, a structurally disturbed region of significant extent is found. Associated with these regions are dislocations, polycrystalline regions, and stacking faults. One can clearly see the jog that occurs in the waveguide region of the modulator structure associated with the "footprint" defect. It was necessary to increase the V/III ratio to 20:1 and the substrate temperature to 700° C. in order to eliminate the occurrence of these "footprints" in the GaAs growth. The best surface morphology for the growth of the 30 percent AlGaAs buffer layers was obtained with a V/III ratio of 10.0:1 and a substrate temperature of 650° C.

The conditions for inserting TEOV described by Akiyama were initially used (bubbling hydrogen through the TEOV at a bubbler temperature 10° C. and a carrier gas flow rate of 10 standard cubic centimeters per minute (sccm)), but it was found that in order to produce semiinsulating GaAs films ($\sim 10^8$ ohm-cm) in our system, it was necessary to raise the source temperature to 20° C. and the carrier gas flow rate to 100 sccm. A number of unexpected problems developed, such as: a) loss in the effectiveness of TEOV doping to continue to produce semi-insulting GaAs films; b) inability to grow N-doped 30 percent AlGaAs buffer layers following growth of TEOV doped guide layers; and c) excessive failure of check valves in the TEOV exhaust lines. TEOV hydrolyzes rapidly, resulting in a deep red color change from the initial orange color of freshly distilled material. Complete hydrolysis yields solid yellow $V_2O_5$ and ethanol. "Old" TEOV kept under hydrogen at room temperature goes from orange to green and eventually black without an accompanying solid product. It is suspected that this is due to a slow dimerization and eventually a polymerization product. This thermal instability can be minimized by maintaining TEOV at subambient conditions when not being processed or when not in use between CVD processing runs. We have maintained samples of TEOV at 0° C. for more than a year with no evidence of dimerization and have, therefore, lowered the TEOV bath temperature in our CVD system to 0° C. between runs. TEOV which shows evidence of dimerization or polymerization can be reclaimed simply by redistillation and results in the recovery of 99 percent of the product. The dimerization results in a significant decrease in the delivery rate of the TEOV, thus accounting for the loss in doping efficiency as the material ages while kept at room temperature. Although TEOV is a metal organic compound, its vapor pressure is significantly lower than that of conventional MO sources such as TMG and TMAL. The presence of the dimer product results in an increase in surface tension of this low vapor pressure liquid resulting in an effective lowering of the vapor pressure and hence a reduction in the delivery rate. The TEOV is maintained in a stainless steel bubbler and is not subject to a visual check. Periodic analysis of the TEOV is performed by checking the delivery rate by bubbling the transported TEOV through a dilute solution of HCl and performing an ICP analysis to determine the vanadium content.

In experiments conducted to determine a delivery schedule for a series of carrier gas flow rates and TEOV bubbler temperatures, it was realized that TEOV exhibited a great tendency to coat the walls of the stainless steel transfer lines. This means that a low vapor pressure liquid such a TEOV will persist, after it is used in a run, to grow a semi-insulating guide layer and will lead to compensation in the subsequent growth of the N-type 30 percent AlGaAs buffer layer. Employing SIMS (secondary ion mass spectroscopy) analysis, it was determined that the affinity of AlGaAs for oxygen during TEOV doping is three orders of magnitude greater than that of GaAs. Oxygen acts as a deep level in AlGaAs and it is understandable that the subsequent AlGaAs layers grown would be compensated. The final approach involved employing heated delivery lines to prevent absorption of TEOV, shifting the point of introduction of the TEOV into the reactor downstream from the input of the MO precursors, and adding valving to permit reverse flushing of the input TEOV line prior to starting growth of the doped AlGaAs layers following TEOV doping.

There was a conventional bypass around the reactor in the TEOV line, so that the TEOV could be stabilized before it was passed into the reactor. TEOV that was bypassed was transferred to a conventional burn box. The failure of the check valve in this TEOV bypass exhaust line was solved by heating the check valve. Finally, clogging of the TEOV exhaust line due to decomposition of the TEOV at the exit into the burn box was handled by introducing a cold trap in the bypass line before the exit to remove the offending TEOV. The knowledge assimilated on the properties of TEOV coupled with the necessary system modifications has led to successful trouble-free use of TEOV to produce semi-insulating films as well as its use as a compensating agent to produce films meeting requirements for applications requiring low background carrier concentration material.

The flow parameters, and source and substrate temperatures, established for GaAs and 30 percent AlGaAs growth, are tabulated in Table I. The TMG (trimethyl gallium) and TMAL were maintained in temperature controlled baths as specified and transported by a hydrogen carrier gas at the flow listed in the table. In addition to the parameters shown there, when a GaAs guide layer is grown, TEOV is added by passing $H_2$ through a bubbler at 20 sccm. The hydrogen flow rate through the TEOV bubbler and the other TEOV parameters are adjusted to provide a fully depleted guide layer, which is taken to mean a free electron concentration of about $5 \times 10^{12}$, within a factor of 2, for a 5 micron thick waveguide. Other waveguides with different thickness will require a different concentration that may readily be calculated from standard texts. TEOV much in excess of that amount will increase the optical absorption in the waveguide, so the amount of TEOV should be close to the minimum required for depletion. For semi-insulating GaAs layers, the TEOV mixture will be adjusted such that the resistivity is greater than about $10^8$ ohm-cm. In the doped $Al_xGa_{1-x}As$ layers, dimethyl zinc was employed as a P-dopant and hydrogen selenide as an N-dopant.

At the start of a growth run, an arsenic ambient must be provided to prevent arsenic loss from the substrate during heat up to the growth temperature. This is accomplished by the Thermal decomposition of arsine (10% $AsH_3$ in $H_2$) which is introduced into the reactor at a rate of 100 sccm. This flow rate is one fifth that required for the growth of GaAs. It is important to reduce the flow to minimize the build-up of arsenic wall deposits prior to the initiation of GaAs growth. Higher flow rates will only lead to an excessive build-up of arsenic on the reactor walls resulting in the formation of poorly adherent wall deposits and to generating of particulates leading to highly defected growth.

For purposes of the following claims, the term growing an epitaxial layer on a substrate will be taken to mean the bulk substrate plus any lower layers. Thus, growing a GaAs layer above an AlGaAs layer that is on a GaAs substrate will be referred to as growing the GaAs layer on a GaAs substrate. The flow rates will vary depending on the volume of the reactor. Those skilled in the art will readily be able to adopt the parameters shown to accommodate reactors of different size.

It should be understood that the invention is not limited to the particular embodiments shown and described herein, but that various changes and modifications may be made without departing from the spirit and scope of this novel concept as defined by the following claims.

TABLE I

|  | GaAs | 30% AlGaAs |
|---|---|---|
| Hydrogen | 3000 sccm* | 3000 sccm |
| $AsH_3$, (10% $AsH_3$ + $H_2$) | 500 sccm | 250 sccm |
| TMG 0°C. | 25 sccm | 22 sccm |
| TMAL 24° C. | — | 22 sccm |
| Growth Temperature | 700° C. | 650° C. |
| V/III | 20 | 10 |

*Standard cubic centimeter per minute (sccm).

We claim:

1. A method of growing an epitaxial layer of GaAs on a GaAs substrate in a reactor in an MOCVD process comprising the steps of:

heating said GaAs substrate to a predetermined growth temperature while flowing arsine over said substrate at a predetermined arsine heating flow rate sufficient to prevent decomposition of the surface of said GaAs substrate; and flowing TMG at a TMG growth flow rate and an arsine mixture of arsine and hydrogen at an arsine growth flow rate into said reactor through a TMG entry point and an arsine entry point along a gas path having a downstream direction into said reactor and over said GaAs substrate at a predetermined As/Ga ratio while said substrate is maintained at said growth temperature, characterized in that:

said arsine heating flow rate is substantially equal to the minimum flow rate required to prevent thermal decomposition of said GaAs substrate, being such that the partial pressure of As in the reactor ambient is substantially equal to the vapor pressure of As above said GaAs substrate, and is substantially less than said arsine growth flow rate, whereby said arsine heating flow rate increases the adherence of As deposits on walls of said reactor; and said As/Ga ratio is substantially 20:1, whereby said epitaxial layer of GaAs is grown to a thickness of at least about 100 μm on said GaAs substrate such that said epitaxial layer of GaAs is substantially defect free.

2. A method according to claim 1, comprising the further steps of:

passing hydrogen gas at a predetermined hydrogen flow rate through a bubbler containing TEOV at a predetermined bubbler temperature in excess of 10° C. to form a TEOV mixture; and flowing said TEOV mixture directly into said reactor at a point in said gas path downstream from said TMG and arsine entry points and over said GaAs substrate simultaneously with said arsine mixture and said TMG to form GaAs doped with a predetermined concentration of deep traps.

3. A method according to claim 2, in which said bubbler temperature is substantially 20° C.

4. A method according to claim 2 in which said growth temperature is substantially 700° C.

5. A method according to claim 4, in which said bubbler temperature is substantially 20° C.

6. A method according to claim 2, further characterized in that said hydrogen-flow rate is set to a predetermined value such that the free electron concentration in said GaAs epitaxial layer is fully depleted at zero applied field.

7. A method according to claim 2, further characterized in that said hydrogen flow rate is set to a predetermined value such that the resistivity of said GaAs epitaxial layer is greater than about $10^8$ ohm-cm.

8. A method accord to claim 1, in which said growth temperature is substantially 700° C.

9. A method according to claim 1, in which said growth temperature is substantially 650° C.

10. A method of growing an epitaxial layer of GaAs on a GaAs substrate in a reactor in an MOCVD process comprising the steps of:

heating said GaAs substrate to a predetermined growth temperature while flowing arsine over said substrate at a predetermined arsine heating flow rate sufficient to prevent decomposition of the surface of said GaAs substrate; and flowing TMG at a TMG growth flow rate and an arsine mixture of arsine and hydrogen at an arsine growth flow rate into said reactor through a TMG entry point and an arsine entry point along a gas path having a downstream direction into said reactor and over said GaAs substrate at a predetermined As/Ga ratio while said substrate is maintained at said growth temperature, characterized in that:

said method includes the further steps of passing hydrogen gas at a predetermined hydrogen flow rate through a bubbler containing TEOV at a predetermined bubbler temperature in excess of 10° C. to form a TEOV mixture; and flowing said TEOV mixture directly into said reactor at a point in said gas path downstream from said TMG and arsine entry points and over said GaAs substrate simultaneously with said arsine mixture and said TMG to form GaAs doped with a predetermined concentration of deep traps; and in which said arsine heating flow rate is substantially equal to the minimum flow rate required to prevent thermal decomposition of said GaAs substrate, being such that the partial pressure of As in the reactor ambient is substantially equal to the vapor pressure of As above said GaAs substrate, and is substantially less than said arsine growth flow rate;

said As/Ga ratio is substantially 20:1, and said TMG and said arsine mixture are passed through a filter prior to entry into said reactor and said TEOV mixture is passed directly into said reactor, whereby said epitaxial layer of GaAs is grown to a thickness of at least about 100 $\mu$m on said GaAs substrate.

11. A method of growing an epitaxial layer of $Al_xGa_{1-x}As$ on a GaAs layer disposed above a GaAs substrate in a reactor in an MOCVD process comprising the steps of:

heating said GaAs substrate to a predetermined growth temperature while flowing arsine over said substrate at a predetermined arsine heating flow rate sufficient to prevent decomposition of the surface of said GaAs substrate; and flowing TMG at a TMG growth flow rate, TMAL at a TMAL growth flow rate, and an arsine mixture of arsine and hydrogen at an arsine growth flow rate into said reactor through a TMG entry point, TMAL entry point, and an arsine entry point along a gas path having a downstream direction into said reactor and over said GaAs substrate at a predetermined As/Gs ratio while said substrate is maintained at said growth temperature, characterized in that:

said arsine heating flow rate is substantially equal to the minimum flow rate required to prevent thermal decomposition of said GaAs substrate, being such that the partial pressure of As in the reactor ambient is substantially equal to the vapor pressure of As above said GaAs substrate, and is substantially less than said arsine growth rate, whereby said arsine heating flow rate increases the adherence of As deposits on walls of said reactor; and said As/Ga ratio is substantially 10:1, whereby said epitaxial layer of $Al_xGa_{1-x}As$ is grown to a thickness of at least about 100 $\mu$m on said GaAs layer disposed above said GaAs substrate such that said epitaxial layer of $Al_xGa_{1-x}As$ is substantially defect free.

12. A method of growing alternate epitaxial layers of GaAs and $Al_xGa_{1-x}As$ above a GaAs substrate in a reactor in an MOCVD process comprising the steps of:

flowing TMG at a first TMG growth flow rate and a first arsine mixture of arsine and hydrogen at a first arsine growth flow rate into said reactor through a TMG entry point and an arsine entry point along a gas path having a downstream direction into said reactor and over said GaAs substrate at a predetermined As/Ga ratio while said substrate is maintained at a first growth temperature to form said GaAs epitaxial layer; and flowing TMG at a second TMG growth flow rate, TMAL at a TMAL growth flow rate and a second arsine mixture of arsine and hydrogen at a second arsine growth flow rate into said reactor through said TMG entry point along said gas path having a downstream direction into said reactor and over said GaAs substrate at a second predetermined As/Ga ratio while said substrate is maintained at a second growth temperature to form said $Al_xGa_{1-x}As$ epitaxial layer, characterized in that:

before a first of said GaAs and $Al_xGa_{1-x}As$ epitaxial layers if formed, said GaAs substrate is heated to a predetermined substrate temperature while flowing arsine over said substrate at a predetermined arsine heating flow rate sufficient to prevent decomposition of the surface of said GaAs substrate, said arsine heating flow rate being substantially equal to the minimum rate required to prevent thermal decomposition of said GaAs substrate, being such that the partial pressure of As in the reactor ambient is substantially equal to the vapor pressure of As above said GaAs substrate, and is substantially less than both said first and second arsine growth flow rates; and said method further includes the step of passing hydrogen gas at a predetermined hydrogen flow rate through a bubbler containing TEOV at a predetermined bubbler temperature in excess of 10° C. to form a TEOV mixture; and flowing said TEOV mixture directly through a TEOV line into said reactor at a point in said gas path downstream from said TMG and arsine entry points and over said GaAs substrate simultaneously with said arsine mixture and said TMG to form GaAs doped with a predetermined concentration of deep traps until said epitaxial GaAs layer has reached a predetermined thickness, and reverse flushing said TEOV line before commencing the step of growing said $Al_xGa_{1-x}As$ epitaxial layer.

* * * * *